United States Patent
Higuchi

(10) Patent No.: US 9,136,218 B2
(45) Date of Patent: Sep. 15, 2015

(54) SEMICONDUCTOR DEVICE INCLUDING A PROTECTIVE FILM

(71) Applicant: ROHM CO., LTD., Kyoto (JP)

(72) Inventor: Shingo Higuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 13/741,670

(22) Filed: Jan. 15, 2013

(65) Prior Publication Data

US 2013/0140710 A1     Jun. 6, 2013

Related U.S. Application Data

(62) Division of application No. 13/158,191, filed on Jun. 10, 2011, which is a division of application No. 12/497,531, filed on Jul. 2, 2009, now Pat. No. 7,977,771.

(30) Foreign Application Priority Data

Jul. 4, 2008 (JP) .................................. 2008-175581

(51) Int. Cl.
  *H01L 23/538* (2006.01)
  *H01L 23/00* (2006.01)

(52) U.S. Cl.
  CPC ............. *H01L 23/5384* (2013.01); *H01L 24/11* (2013.01); *H01L 2224/0401* (2013.01); *H01L 2224/05572* (2013.01); *H01L 2224/13099* (2013.01); *H01L 2224/16* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01033* (2013.01)

(58) Field of Classification Search
  CPC ..... H01L 24/13; H01L 2224/16; H01L 24/16; H01L 24/81
  USPC .................................. 257/698, 737, 738, 774
  See application file for complete search history.

(56) References Cited

U.S. PATENT DOCUMENTS

| 6,075,290 | A  | * | 6/2000 | Schaefer et al. | ............... 257/737 |
| 6,452,270 | B1 | * | 9/2002 | Huang | ............ 257/738 |
| 6,522,016 | B1 | * | 2/2003 | Makino et al. | ................ 257/778 |
| 6,545,355 | B2 | * | 4/2003 | Yanagida | ....................... 257/738 |
| 7,271,499 | B2 |   | 9/2007 | Hashimoto | |
| 7,755,205 | B2 |   | 7/2010 | Hashimoto | |

(Continued)

FOREIGN PATENT DOCUMENTS

| JP | 06-177134 A | 6/1994 |
| JP | 2004-063729 A | 2/2004 |

(Continued)

*Primary Examiner* — Ngan Ngo
(74) *Attorney, Agent, or Firm* — Rabin & Berdo, P.C.

(57) ABSTRACT

A semiconductor device includes a semiconductor chip having a wire and a passivation film formed on the outermost surface with an opening partially exposing the wire. A resin layer is stacked on the semiconductor chip and provided with a through-hole in a position opposed to a portion of the wire facing the opening. A pad is formed on a peripheral portion of the through-hole in the resin layer and in the through-hole so that an external connection terminal is arranged on the surface thereof. The peripheral portion of the resin layer is formed more thickly than the remaining portion of the resin layer other than the peripheral portion.

22 Claims, 4 Drawing Sheets

(56) References Cited

U.S. PATENT DOCUMENTS

| | | |
|---|---|---|
| 7,777,333 B2 * | 8/2010 | Bachman et al. ............ 257/737 |
| 7,888,177 B2 | 2/2011 | Hashimoto |
| 2002/0048916 A1 | 4/2002 | Yanagida |
| 2003/0011078 A1 | 1/2003 | Fukao et al. |
| 2006/0220215 A1 | 10/2006 | Lee |
| 2007/0001317 A1 * | 1/2007 | Matsuoka et al. ........... 257/780 |
| 2007/0007664 A1 | 1/2007 | Lee et al. |
| 2008/0296717 A1 | 12/2008 | Beroz et al. |
| 2009/0181521 A1 | 7/2009 | Hashimoto |
| 2009/0218687 A1 | 9/2009 | Chou et al. |
| 2009/0229872 A1 | 9/2009 | Takaike |
| 2009/0289362 A1 | 11/2009 | Rhyner et al. |
| 2011/0021005 A1 | 1/2011 | Inada et al. |
| 2012/0098124 A1 * | 4/2012 | Wu et al. ...................... 257/737 |

FOREIGN PATENT DOCUMENTS

| | | |
|---|---|---|
| JP | 2004-207268 | 7/2004 |
| JP | 2008-091632 A | 4/2008 |

* cited by examiner

SEMICONDUCTOR DEVICE INCLUDING A PROTECTIVE FILM

This is a divisional application of U.S. application Ser. No. 13/158,191, which is a divisional application of U.S. application Ser. No. 12/497,531, filed on Jul. 2, 2009, and issued as U.S. Pat. No. 7,977,771 on Jul. 12, 2011.

FIELD OF THE INVENTION

The present invention relates to a semiconductor device employing a WLCSP (Wafer Chip Size Package) and a method of manufacturing the same.

BACKGROUND OF THE INVENTION

Description of Related Art

Semiconductor devices employing WLCSPS are provided by a large number of semiconductor device manufacturers. In a generally provided semiconductor device, a rewire and a sealing resin layer covering the same are formed on a semiconductor chip, and a post passing through the sealing resin layer is provided between an external connection terminal arranged on the surface of the sealing resin layer and the rewire. In recent years, however, the so-called postless structure omitting the rewire, the sealing resin layer and the post has been watched with interest.

A semiconductor device having the postless structure includes a semiconductor chip 101, as shown in FIG. 4. A passivation film 102 is formed on the outermost surface of the semiconductor chip 101. A wire 103 is formed under the passivation film 102, while an opening 104 partially exposing the wire 102 is formed in the passivation film 102.

A polyimide layer 105 is laminated on the semiconductor chip 101. The polyimide layer 105 covers the overall region of the surface of the passivation film 102, and enters the opening 104. The surface of the polyimide layer 102 is planarized. A through-hole 106 is formed in the portion of the polyimide layer 105 entering the opening 104, to pass through the portion in the thickness direction.

A pad 107 is formed on a portion of the wire 103 facing the through-hole 106. The pad 107 fills up the through-hole 106, and the peripheral edge portion thereof extends onto the polyimide layer 105.

A solder ball 108 is arranged on the pad 107. The solder ball 108 is connected to a substrate pad provided on a mounting substrate, so that the semiconductor device is mounted on the mounting substrate (electrically and mechanically connected to the mounting substrate).

The base of the semiconductor chip 101 is made of silicon, for example. On the other hand, the base of the mounting substrate is made of glass epoxy resin, for example. The thermal expansion coefficient of glass epoxy resin is greater than that of silicon. If heat is applied to the semiconductor device and the mounting substrate when or after the semiconductor device is mounted on the mounting substrate, therefore, the mounting substrate extremely extends beyond the semiconductor chip 101, and the solder ball 108 is collapsingly deformed following the mounting substrate. When the temperatures of the WLCSP and the mounting substrate are thereafter reduced, the semiconductor chip 101 and the mounting substrate are thermally contracted, and the solder ball 108 is restored from the deformed state.

When the solder ball 108 is collapsingly deformed, remarkable stress is caused on the portions of the pad 106 and the wire 103 connected with each other. If the solder ball 108 is repetitively deformed and restored, therefore, the pad 107 and/or the portion of the wire 103 connected with the pad 107 may be fractured due to repetitive caused remarkable stress.

SUMMARY OF THE INVENTION

An object of the present invention is to provide a semiconductor device and a method of manufacturing the same, capable of reducing stress caused on portions of a pad and a wire connected with each other due to a difference between the quantities of thermal expansion of a semiconductor chip and a mounting substrate.

A semiconductor device according to an aspect of the present invention includes: a semiconductor chip including a wire and a passivation film formed on the outermost surface with an opening partially exposing the wire; a resin layer stacked on the semiconductor chip and provided with a through-hole in a position opposed to a portion of the wire facing the opening; and a pad formed on a peripheral portion of the through-hole in the resin layer and in the through-hole so that an external connection terminal is arranged on the surface thereof. The peripheral portion of the resin layer is formed more thickly than the remaining portion of the resin layer other than the peripheral portion.

In the semiconductor device, the passivation film is formed on the outermost surface of the semiconductor chip. The wire formed on the semiconductor chip is covered with the passivation film. The opening partially exposing the wire is formed in the passivation film. The resin layer is stacked on the semiconductor chip. The resin layer is provided with the through-hole passing through the same in the thickness direction on the position opposed to the portion of the wire facing the opening. The pad is formed on the peripheral portion of the through-hole in the resin layer and in the through-hole. The external connection terminal is arranged on the surface of the pad.

In the resin layer, the peripheral portion of the through-hole is locally thickly formed. Thus, when a difference in quantity of thermal expansion is caused between the semiconductor chip and a mounting substrate and the external connection terminal arranged on the pad is collapsingly deformed upon or after mounting of the semiconductor chip on the mounting substrate, stress is caused on the locally thickly formed portion (the peripheral portion of the through-hole) of the resin layer. Consequently, stress caused on portions of the pad and the wire connected with each other can be reduced. Therefore, fracture (fatigue fracture) of the pad and/or the portion of the wire connected with the pad can be suppressed.

The side surface of the pad may be generally flush with a side surface formed by the difference between the thicknesses of the peripheral portion and the remaining portion other than the peripheral portion in the resin layer.

The semiconductor device can be manufactured by a method including the following steps A1 to A5:

A1. forming a first resin layer on a semiconductor chip having a passivation film formed on the outermost surface with an opening partially exposing a wire by supplying a resin material;

A2. patterning the first resin layer so that the first resin layer selectively remains on at least a portion of the wire facing the opening;

A3. forming a second resin layer on the semiconductor chip by supplying a resin material after patterning the first resin layer;

A4. forming a through-hole continuously passing through the first resin layer and the second resin layer in positions of the first resin layer and the second resin layer opposed to a portion of the wire exposed from the passivation film through the opening; and A5. forming a pad so that an external connection terminal is arranged on the surface thereof by depositing a conductive material on a peripheral portion of the through-hole in the second resin layer and in the through-hole.

The semiconductor device can also be manufactured by a method including the following steps B1 to B4:

B1. forming a resin layer on a semiconductor chip having a passivation film formed on the outermost surface with an opening partially exposing a wire by supplying a resin material;

B2. patterning the resin layer so that the thickness on at least a portion of the wire facing the opening is larger than the thickness of the remaining portion by forming a mask on a portion of the surface of the resin layer opposed to the opening and removing a portion of the resin layer exposed from the mask by a prescribed thickness;

B3. removing the mask and forming a through-hole passing through the resin layer in a portion of the resin layer exposed due to the removal of the mask after patterning the resin layer; and B4. forming a pad so that an external connection terminal is arranged on the surface thereof by depositing a conductive material on a peripheral portion of the through-hole in the resin layer and in the through-hole.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
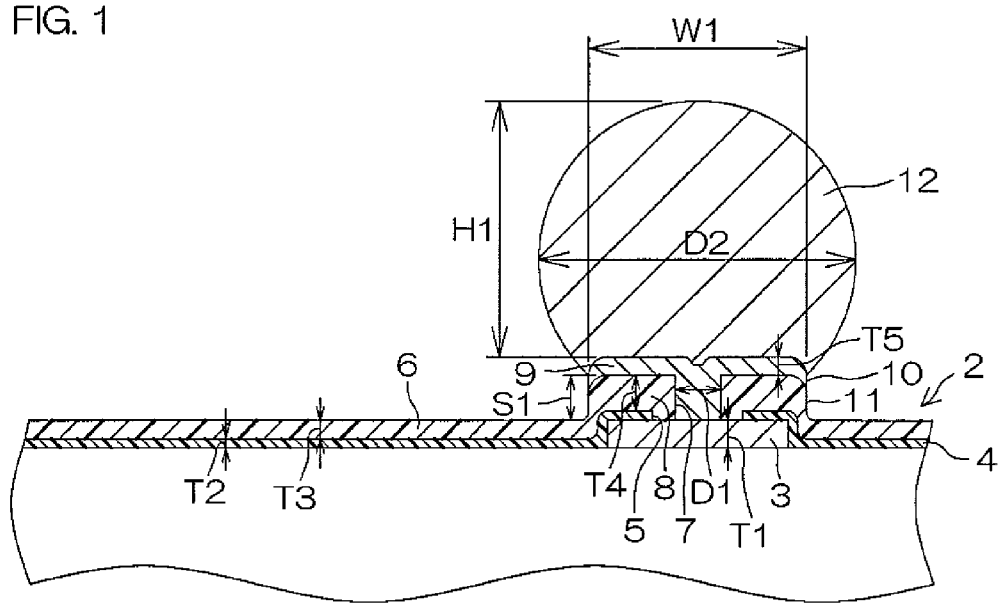
FIG. 1 is a schematic sectional view of a semiconductor device according to an embodiment of the present invention.

FIG. 1 is a schematic sectional view of a semiconductor device according to an embodiment of the present invention.

A WLCSP of a postless structure is employed for a semiconductor device 1.

The semiconductor device 1 includes a semiconductor chip 2 based on a silicon substrate quadrilateral in plan view. A wire 3 made of a metallic material such as aluminum is formed on the silicon substrate in a prescribed pattern. A thickness T1 of the wire 3 is 0.8 to 1.2 μm. A passivation film 4 is formed on the outermost surface of the semiconductor chip 2. The passivation film 4 is made of silicon oxide ($SiO_2$) or silicon nitride (SiN), for example. A thickness T2 of the passivation film 4 is 1.0 to 1.2 μm. An opening 5 partially exposing the wire 3 is formed in the passivation film 4.

A polyimide layer 6 made of photosensitive polyimide is laminated on the semiconductor chip 2. The polyimide layer 6 covers the overall region of the surface of the passivation film 4, and enters the opening 5. A through-hole 7 is formed in the portion of the polyimide layer 6 entering the opening 5, to pass through the same in the thickness direction. A diameter D1 of the through-hole 7 is 45 to 200 μm. A peripheral portion 8 of the through-hole 7 in the polyimide layer 6 is formed more thickly than the remaining portion of the polyimide layer 6 other than the peripheral portion 8. For example, the portion other than the peripheral portion 8 has a thickness T3 of 1 to 10 μm, while the peripheral portion 8 has a thickness T4 of 8 to 40 μm. Thus, a step S1 of 15 to 50 μm is formed between a top surface of the peripheral portion 8 and a top surface of the portion other than the peripheral portion.

A pad 9 made of a metallic material such as aluminum is formed on a portion of the wire 3 facing the through-hole 7. The pad 9 fills up the through-hole 7, and the peripheral edge portion thereof extends onto the polyimide layer 6. A side surface 10 of the pad 9 is generally flush with a side surface 11 formed by the difference between the thicknesses of the peripheral portion 8 and the remaining portion other than the peripheral portion 8 in the polyimide layer 6. A width W1 of the pad 9 is 200 to 300 μm. A thickness of the pad 9 on the peripheral portion 8 is 5 to 30 μm.

A ball-shaped external connection terminal 12 is arranged on the pad 9. The external connection terminal 12 is made of solder, for example. A diameter D2 of the external connection terminal 12 is 200 to 300 μm. A height H1 between a top surface of the pad 9 and a top edge of the external connction terminal is 80 to 250 μm. The external connection terminal 12 is connected to a substrate pad provided on a mounting substrate (not shown), so that the semiconductor device 1 is mounted on the mounting substrate (electrically and mechanically connected to the mounting substrate).

FIGS. 2A to 2F are schematic sectional views for illustrating a method of manufacturing the semiconductor device 1.

The semiconductor device 1 is manufactured in a wafered state of silicon substrates forming semiconductor chips 2. The passivation film 4 is formed on the outermost surfaces of the semiconductor chips 2 (the wafer). Under the passivation film 4, the wire 3 is formed in the prescribed pattern in a region corresponding to each semiconductor chip 2.

Figure 2A:
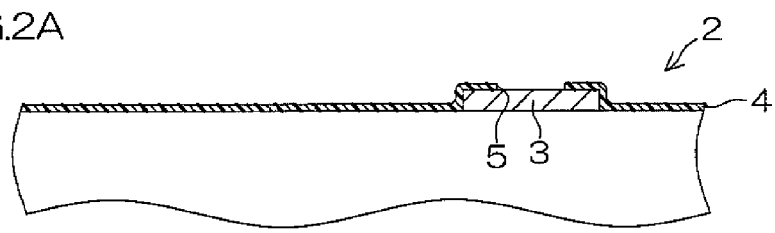
FIGS. 2A to 2F are schematic sectional views successively showing a method of manufacturing the semiconductor device shown in FIG. 1.

First, the opening 5 is formed in the portion of the passivation film 4 opposed to the wire 3 by photolithography and etching, as shown in FIG. 2A.

Figure 2B:
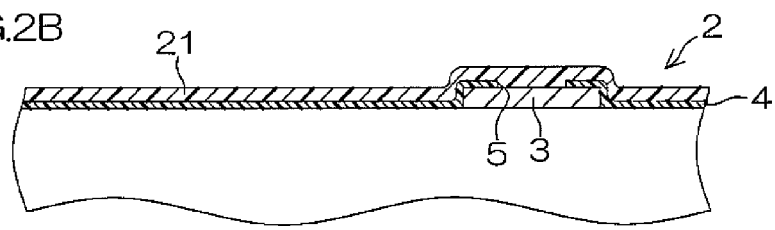

Then, polyamic acid is applied onto the surface of the passivation film 4 and the portion of the wire 3 facing the opening 5. Then, the polyamic acid is imidized, whereby a first polyimide layer 21 is formed on the surface of the passivation film 4 and the portion of the wire 3 facing the opening 5, as shown in FIG. 2B.

Figure 2C:
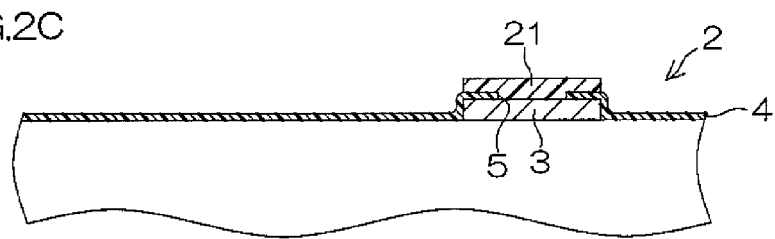

Thereafter the first polyimide layer 21 is patterned by photolithography, as shown in FIG. 2C. The first polyimide layer 21 is selectively left in the opening 5 and on the peripheral portion of the opening 5 and removed from the remaining portion due to the patterning.

Figure 2D:
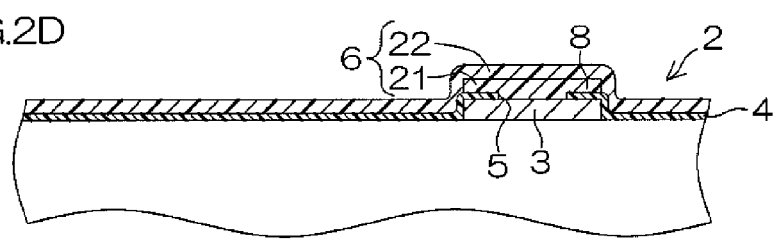

Then, polyamic acid is deposited on the passivation film 4 and the first polyimide layer 21 by CVD (Chemical Vapor Deposition). Then, the polyamic acid is imidized, whereby a second polyimide layer 22 is formed on the passivation film 4 and the first polyimide layer 21, as shown in FIG. 2D. The second polyimide layer 22 is integrated with the first polyimide layer 21, to form the polyimide layer 6 along with the first polyimide layer 21. Thus, the portion (the peripheral portion) 8 formed by the first and second polyimide layers 21 and 22 has a thickness larger than that of the portion formed by only the second polyimide layer 2 in the polyimide layer 6.

Figure 2E:
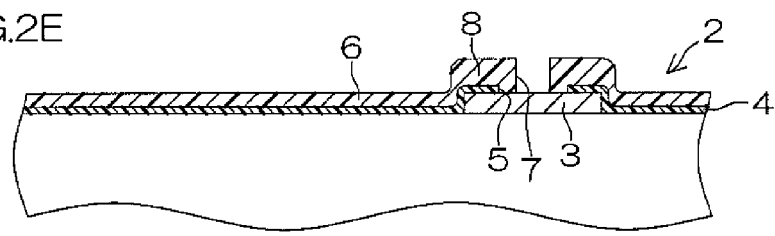
Figure 2F:
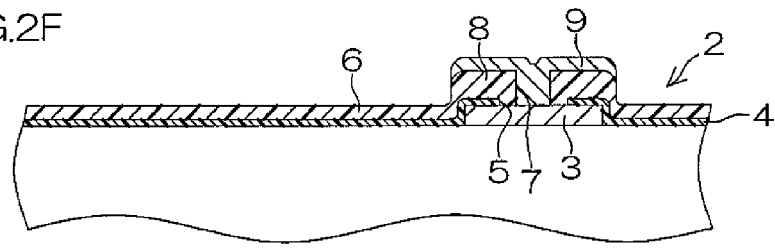

Then, the through-hole 7 is formed in the polyimide layer 6 by photolithography and etching, as shown in FIG. 2E.

Then, a metal film (not shown) made of the material for the pad 9 is formed on the polyimide layer 6 including the through-hole 7 by sputtering. Then, the metal film is selectively removed by photolithography and etching, as shown in FIG. 2E Thus, the pad 9 is formed on the peripheral portion 8 of the through-hole 7 in the polyimide layer 6.

Thereafter the external connection terminal 12 is arranged on the pad 9. Then, the wafer is cut (diced) along dicing lines set between the semiconductor chips 2 in the wafer along with the passivation film 4 and the polyimide layer 6, whereby the semiconductor device 1 shown in FIG. 1 is obtained.

As hereinabove described, the passivation film 4 is formed on the outermost surface of the semiconductor chip 2. The passivation film 4 is provided with the opening 5 partially exposing the wire 3 provided under the same. The polyimide layer 6 is stacked on the semiconductor chip 2. The polyimide layer 6 is provided with the through-hole 7 passing through the same in the thickness direction in the position opposed to the portion of the wire 3 facing the opening 5. The pad 9 is formed on the peripheral portion 8 of the through-hole 7 of the polyimide layer 6 and in the through-hole 7, so that the external connection terminal 12 is arranged on the surface thereof.

In the polyimide layer 6, the peripheral portion 8 of the through-hole 7 is locally thickly formed. Thus, when a difference in quantity of thermal expansion is caused between the semiconductor chip 2 and the mounting substrate and the external connection terminal 12 arranged on the pad 9 is collapsingly deformed upon or after mounting of the semiconductor chip 2 on the mounting substrate, stress is caused on the peripheral portion 8 of the through-hole 7 in the polyimide layer 6. Since the step S1 between the top surface of the peripheral portion 8 and the top surface of the portion other than the peripheral portion is 15 to 50 μm, the stress can be absorbed at the peripheral portion 8. Consequently, stress caused on the portions of the pad 9 and the wire 3 connected with each other can be reduced. Therefore, fracture (fatigue fracture) of the pad 9 and/or the portion of the wire 3 connected with the pad 9 can be suppressed.

FIGS. 3A to 3F are schematic sectional views for illustrating another method of manufacturing the semiconductor device 1.

The semiconductor device 1 is manufactured in a wafered state of silicon substrates forming semiconductor chips 2. The passivation film 4 is formed on the outermost surfaces of the semiconductor chips 2 (the wafer). Under the passivation film 4, the wire 3 is formed in the prescribed pattern in a region corresponding to each semiconductor chip 2.

Figure 3A:
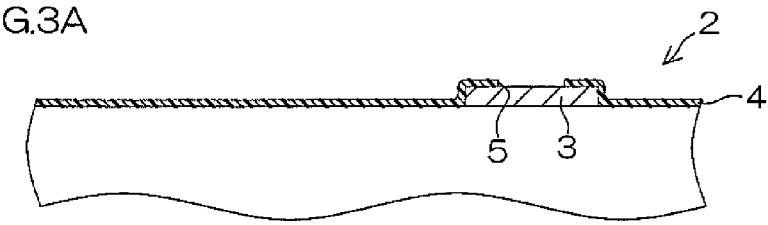
FIGS. 3A to 3F are schematic sectional views successively showing another method of manufacturing the semiconductor device shown in FIG. 1.

First, the opening 5 is formed in the portion of the passivation film 4 opposed to the wire 3 by photolithography and etching, as shown in FIG. 3A.

Figure 3B:
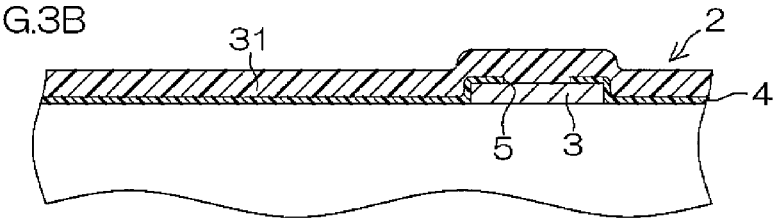

Then, polyamic acid is deposited on the surface of the passivation film 4 and the portion of the wire 3 facing the opening 5 by CVD. Then, the polyamic acid is imidized, whereby a polyimide layer 31 is formed on the surface of the passivation film 4 and the portion of the wire 3 facing the opening 5 so that a surface portion thereof opposed to the wire 3 protuberates correspondingly to the wire 3, as shown in FIG. 3B.

Figure 3C:
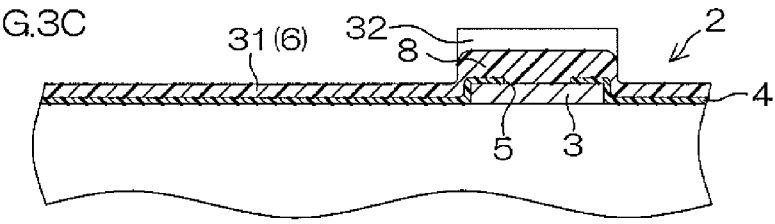

Thereafter a mask 32 is selectively formed on the protuberating surface portion of the polyimide layer 31 by photolithography and etching, as shown in FIG. 3C. Then, a portion of the polyimide layer 31 exposed from the mask 32 is removed by a prescribed thickness. Thus, the polyimide layer 31 forms the polyimide layer 6 with the portion (the peripheral portion) 8 opposed to the wire 3 formed more thickly than the remaining portion. Thereafter the mask 32 is removed from the polyimide 6.

Figure 3D:
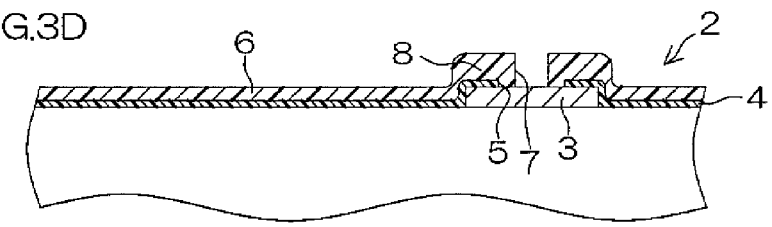

Then, the through-hole 7 is formed in the polyimide layer 6 by photolithography and etching, as shown in FIG. 3D.

Figure 3E:
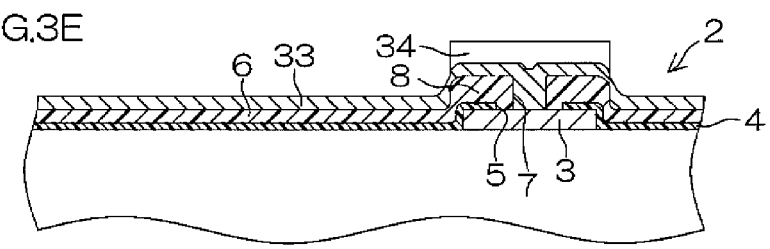

Then, a metal film 33 made of the material for the pad 9 is formed on the polyimide layer 6 including the through-hole 7 by sputtering, as shown in FIG. 3E. Then, a mask 34 is formed on the metal film 33 by photolithography and etching with a reticle (a photomask) identical to that used for forming the mask 32.

Figure 3F:
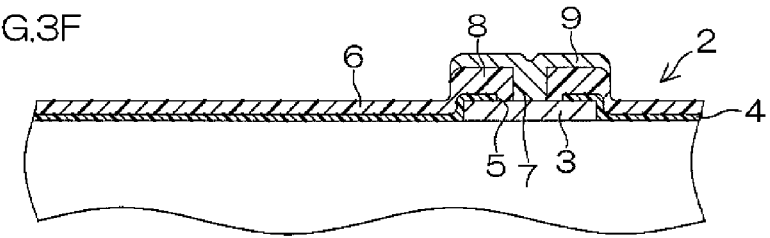
Figure 4:
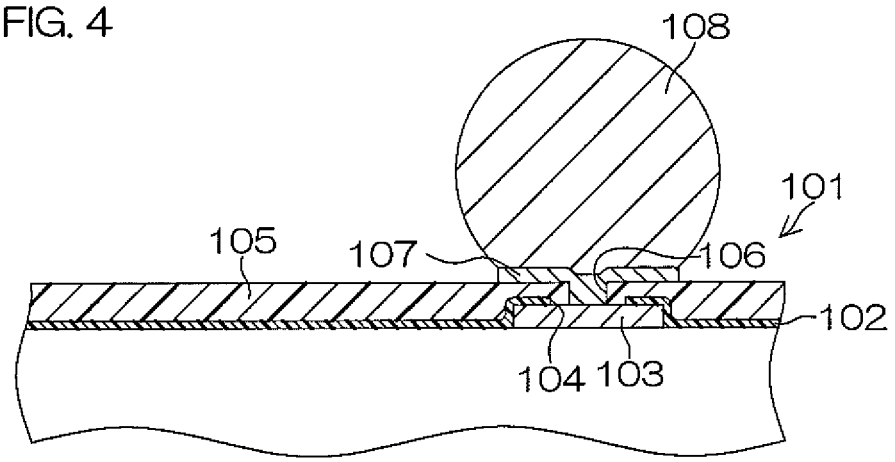
FIG. 4 is a schematic sectional view of a conventional semiconductor device.

Then, the pad 9 is formed by etching the metal film 33 through the mask 34, as shown in FIG. 3F.

Thereafter the external connection terminal 12 is arranged on the pad 9. Then, the wafer is cut (diced) along the dicing lines set between the semiconductor chips 2 in the wafer along with the passivation film 4 and the polyimide layer 6, whereby the semiconductor device 1 shown in FIG. 1 is obtained.

According to the method, the mask 32 for selectively removing the polyimide layer 31 and the mask 34 for selectively removing the metal film 33 can be formed by photolithography and etching employing the same reticle. Therefore, the number of reticles necessary for manufacturing the semiconductor device 1 can be reduced, and the manufacturing cost for the semiconductor device 1 can be reduced.

While the resin layer is formed by the polyimide layer 6 made of photosensitive polyimide in the aforementioned embodiment, the resin layer may alternatively be formed by a layer made of a material other than the photosensitive polyimide. Polyamidimide or epoxy resin can be illustrated as the material other than the photosensitive polyimide.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-175581 filed with the Japan Patent Office on Jul. 4, 2008, the disclosure of which is incorporated herein by reference.

What is claimed is:

1. A semiconductor device comprising:
   a semiconductor chip including a wire and a first protective film formed on the outermost surface of the wire with an opening partially exposing the wire;
   a second protective film stacked on the semiconductor chip and provided with a through-hole in a position opposed to a portion of the wire facing the opening;
   an external connection terminal; and
   an external connection portion formed on the second protective film and in the entire cavity of the through-hole;
   wherein the second protective film has a thick portion provided outside of a peripheral portion of the through-hole;
   wherein the peripheral portion of the through-hole in the second protective film is disposed adjacent to the through-hole;
   wherein the thick portion of the second protective film is disposed adjacent to an outside portion of the external connection portion;
   wherein a first thin portion is a portion of the second protective film that is thinner than the thick portion and is provided between the peripheral portion and the thick portion;
   wherein a second thin portion is a portion of the second protective film that is separated from the first thin portion and is provided outside of the thick portion;

wherein the second thin portion is thinner than both the peripheral portion and the thick portion;
wherein the external connection terminal is formed on a surface of the external connection portion; and
wherein the external connection portion is a single layer.

2. The semiconductor device according to claim 1, wherein the peripheral portion of the second protective film is thicker than the remaining portion of the second protective film other than the peripheral portion and the thick portion.

3. The semiconductor device according to claim 2, wherein the side surface of the external connection portion is generally flush with a side surface formed by the difference between the thicknesses of the peripheral portion and the remaining portion in the second protective film.

4. The semiconductor device according to claim 1, wherein the overall region of the surface of the first protective film is in contact with the second protective film.

5. The semiconductor device according to claim 1, wherein the external connection portion includes a filling portion filling up the through-hole and a planar portion integral with the filling portion and extending along the second protective film outside the through-hole, a surface of the planar portion has a recessed portion above a center of the through-hole so that the planar portion has a first portion disposed above the center of the through-hole and a second portion disposed around the first portion, wherein a thickness of the second portion is thicker than a thickness of the first portion.

6. The semiconductor device according to claim 1, wherein the surface of the external connection portion has a recessed portion aligned with a center of the through-hole so that a center portion of the external connection portion is thinner than another portion thereof within an area of the through-hole.

7. The semiconductor device according to claim 1, wherein the surface of the external connection portion has a recessed portion aligned with the through-hole.

8. A semiconductor device comprising:
a semiconductor chip including a wire and a first protective film formed on the outermost surface of the wire with an opening partially exposing the wire;
a second protective film stacked on the semiconductor chip and provided with a through-hole in a position opposed to a portion of the wire facing the opening;
an external connection terminal; and
an external connection portion formed on the second protective film and in the entire cavity of the through-hole;
wherein the second protective film has a thick portion provided outside of a peripheral portion of the through-hole;
wherein the peripheral portion of the through-hole in the second protective film is disposed adjacent to the through-hole;
wherein the thick portion of the second protective film is disposed adjacent to an outside portion of the external connection portion;
wherein a first thin portion is a portion of the second protective film that is thinner than the thick portion and is provided between the peripheral portion and the thick portion;
wherein a second thin portion is a portion of the second protective film that is separated from the first thin portion and is provided outside of the thick portion;
wherein the second thin portion is thinner than both the peripheral portion and the thick portion;
wherein the external connection terminal is formed on a surface of the external connection portion and covers the entire surface of the external connection portion; and
wherein the external connection portion is made of a single material.

9. The semiconductor device according to claim 8, wherein the peripheral portion of the second protective film is thicker than the remaining portion of the second protective film other than the peripheral portion and the thick portion.

10. The semiconductor device according to claim 8, wherein the overall region of the surface of the first protective film is in contact with the second protective film.

11. The semiconductor device according to claim 8, wherein the external connection portion includes a filling portion filling up the through-hole and a planar portion integral with the filling portion and extending along the second protective film outside the through-hole, a surface of the planar portion has a recessed portion above a center of the through-hole so that the planar portion has a first portion disposed above the center of the through-hole and a second portion disposed around the first portion, wherein a thickness of the second portion is thicker than a thickness of the first portion.

12. The semiconductor device according to claim 8, wherein the surface of the external connection portion has a recessed portion aligned with a center of the through-hole so that a center portion of the external connection portion is thinner than another portion thereof within an area of the through-hole.

13. The semiconductor device according to claim 8, wherein the surface of the external connection portion has a recessed portion aligned with the through-hole.

14. A semiconductor device comprising:
a semiconductor chip including a wire and a first protective film formed on the outermost surface of the wire with an opening partially exposing the wire;
a second protective film stacked on the semiconductor chip and provided with a through-hole in a position opposed to a portion of the wire facing the opening;
an external connection terminal; and
an external connection portion formed on the second protective film and in the entire cavity of the through-hole, wherein the surface of the external connection portion faces the wire and extends parallel to the surface of the wire;
wherein the second protective film has a thick portion provided outside of a peripheral portion of the through-hole;
wherein the peripheral portion of the through-hole in the second protective film is disposed adjacent to the through-hole;
wherein the thick portion of the second protective film is disposed adjacent to an outside portion of the external connection portion;
wherein a first thin portion is a portion of the second protective film that is thinner than the thick portion and is provided between the peripheral portion and the thick portion;
wherein a second thin portion is a portion of the second protective film that is separated from the first thin portion and is provided outside of the thick portion;
wherein the second thin portion is thinner than both the peripheral portion and the thick portion;
wherein the external connection terminal is formed on a surface of the external connection portion and covers the entire surface of the external connection portion; and
wherein the external connection portion is a single layer that is made of a single material.

15. The semiconductor device according to claim 14, wherein the overall region of the surface of the first protective film is in contact with the second protective film.

16. The semiconductor device according to claim 14, wherein the external connection portion includes a filling portion filling up the through-hole and a planar portion integral with the filling portion and extending along the second protective film outside the through-hole, a surface of the planar portion has a recessed portion above a center of the through-hole so that the planar portion has a first portion disposed above the center of the through-hole and a second portion disposed around the first portion, wherein a thickness of the second portion is thicker than a thickness of the first portion.

17. The semiconductor device according to claim 1, wherein said second thin portion has a top surface lower than the outermost surface of the wire.

18. The semiconductor device according to claim 1, wherein the peripheral portion includes a portion of the second protective film positioned within the opening of the first protective film when viewed in plan.

19. The semiconductor device according to claim 8, wherein said second thin portion has a top surface lower than the outermost surface of the wire.

20. The semiconductor device according to claim 8, wherein the peripheral portion includes a portion of the second protective film positioned within the opening of the first protective film when viewed in plan.

21. The semiconductor device according to claim 14, wherein said second thin portion has a top surface lower than the outermost surface of the wire.

22. The semiconductor device according to claim 14, wherein the peripheral portion includes a portion of the second protective film positioned within the opening of the first protective film when viewed in plan.

* * * * *